(12) United States Patent
Gudesen et al.

(10) Patent No.: US 6,380,597 B1
(45) Date of Patent: Apr. 30, 2002

(54) READ-ONLY MEMORY AND READ-ONLY MEMORY DEVICE

(76) Inventors: Hans Gude Gudesen, Tyrihansveien 5, N-1639, Gamle Fredrikstad; Per-Erik Nordal, Båastadryggen 19, N-1370, Asker; Geirr I. Leistad, Jongsstubben 19, N-1300, Sandvika, all of (NO)

( * ) Notice: Subject to any disclaimer, the term of this patent is extended or adjusted under 35 U.S.C. 154(b) by 0 days.

(21) Appl. No.: 09/297,521
(22) PCT Filed: Aug. 28, 1998
(86) PCT No.: PCT/NO98/00263
 § 371 Date: Sep. 13, 1999
 § 102(e) Date: Sep. 13, 1999
(87) PCT Pub. No.: WO99/14762
 PCT Pub. Date: Mar. 25, 1999

(30) Foreign Application Priority Data

Sep. 1, 1997 (NO) .................................................. 973993

(51) Int. Cl.$^7$ .............................................. G11C 17/06
(52) U.S. Cl. ........................ 257/390; 257/443; 257/444
(58) Field of Search ................................ 257/390, 443, 257/444

(56) References Cited

U.S. PATENT DOCUMENTS

| | | | |
|---|---|---|---|
| 3,742,592 A | * 7/1973 | Rizzi et al. | 257/390 |
| 4,162,538 A | * 7/1979 | Thornburg | 365/96 |
| 4,575,743 A | * 3/1986 | Hashimoto | 257/390 |
| 5,170,227 A | 12/1992 | Kaneko et al. | 257/67 |
| 5,272,370 A | 12/1993 | French | 257/353 |
| 5,375,085 A | 12/1994 | Gnade et al. | 365/145 |
| 5,464,989 A | 11/1995 | Mori et al. | 257/30 |
| 5,811,337 A | 9/1998 | Wen | 438/275 |
| 5,905,670 A | * 5/1999 | Babson et al. | 365/105 |
| 5,962,903 A | * 10/1999 | Sung et al. | 257/390 |
| 6,087,730 A | * 7/2000 | McGarvey et al. | 257/766 |

FOREIGN PATENT DOCUMENTS

WO  WO 96/41381  12/1996

* cited by examiner

Primary Examiner—Fetsum Abraham
(74) Attorney, Agent, or Firm—Brinks Hofer Gilson & Lione

(57) ABSTRACT

A read-only memory is made electrically addressable over a passive conductor matrix, wherein the volume between intersection of two conductors (2; 4) in the matrix defines a memory cell (5). Data are stored as impedance values in the memory cells. The memory cells (5) comprise either an isolating material (6) which provides high impedance or one or more inorganic or organic semiconductors (9), preferably with an anisotropic conducting property. The semiconductor material (9) forms a diode junction at the interface to a metallic conductor (2; 4) in the matrix. By suitable arrangement of respectively the isolating material (6) and semiconductor material (9) in the memory cells these may be given a determined impedance value which may be read electrically and corresponds to logical values in a binary or multi-valued code. One or more read-only memories (ROM) may be provided on a semiconductor substrate (1) which also comprises driver and control circuits (13), to accomplish a read-only memory device. The device may be realized either planar or also volumetrically by stacking several read-only memories (ROM) in horizontal layers (15) and connecting them with the substrate (1) via addressing buses.

44 Claims, 7 Drawing Sheets

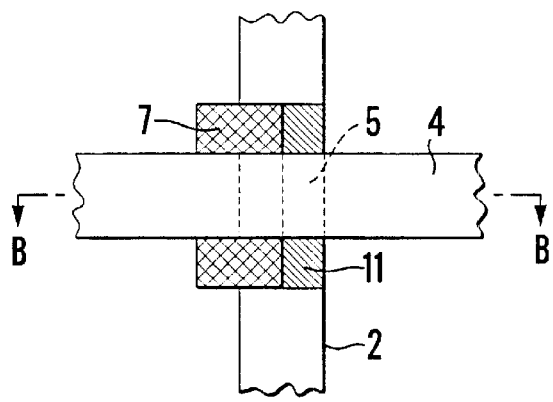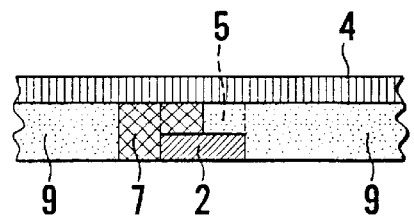
Fig.5a　　　　　Fig.5b
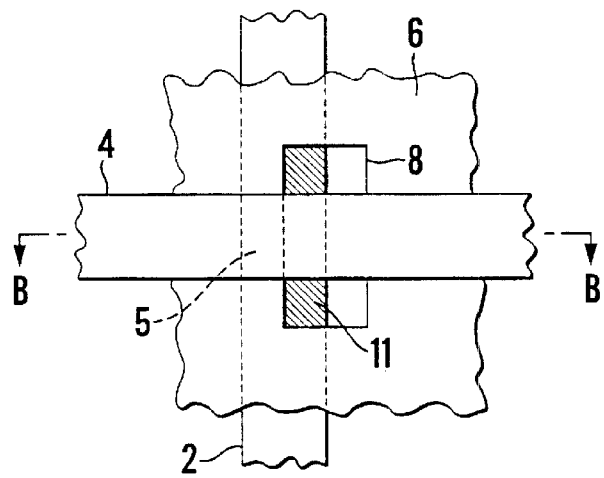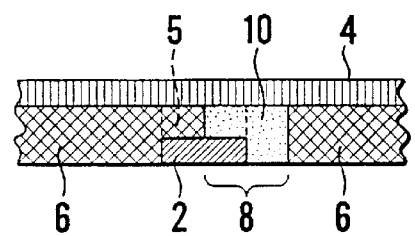
Fig.6a　　　　　Fig.6b

READ-ONLY MEMORY AND READ-ONLY MEMORY DEVICE

The present invention concerns an electrically addressable, non-volatile read-only memory, comprising an electrically addressable non-volatile read-only memory, comprising a plurality of memory cells which in a write operation comprising a part of the manufacturing process of the read-only memory, permanently each are assigned one or two or more logic states according to a determined protocol which in the memory defines permanently written or stored data, and a passive matrix of electrical conductors for the addressing. The passive electrical conductor matrix comprises a first and a second electrode structure in respective mutually spaced apart and parallel planes and with parallel electrodes in each plane and provided such that the electrodes form a substantially orthogonal x,y matrix wherein the electrodes in the first electrode structure comprise the columns of the matrix or x electrodes and the electrodes in the second electrode structure comprise the rows of the matrix or y electrodes, wherein at least a portion of the volume between the intersection of an x electrode and a y electrode defines a memory cell in the read-only memory. The mutually overlapping portions of the x electrode and the y electrode in the memory cell, each defines a contact area in the memory cell, wherein at least one semiconductor material is provided between the electrode structures and with rectifying properties in relation to a selected electrical conducting electrode material, and an electrical isolating material, wherein the semiconductor material in electrical contact with an electrode in the memory cell forms a diode junction in the interface between semiconductor material and electrode material.

The invention also concerns a read-only memory device which comprises one or more read-only memories according to the invention, and a read-only memory device which comprises two or more read-only memories according to the invention.

Matrix addressing of data storage locations or bit spots on a plane is a simple and efficient way of achieving a great number of accessible memory locations with a moderate number of electrical addressing lines. In a square x,y matrix with n lines respectively both in the x direction and the y direction the number of memory locations scales as $n^2$. In one form or another this basic principle is at present implemented in a large number of different embodiments of solid state memory means. In these the memory location comprises a simple electronic circuits which communicates to the outside via the intersection in the matrix and a memory element, typically a charge storage device. Even if such means have been technically and commercially very successful, they have a number of disadvantages, and particularly each memory location has a complex architecture which leads to increased costs and reduced data storage density. In the large subclass of so-called volatile memory means the circuits must constantly sustain a current supply with accompanying heating and consumption of electric power in order to maintain the stored information. On the other hand non-volatile means avoid this problem, but with the trade-off of a reduced access and switching time as well as increased consumption and high complexity.

RELATED PRIOR ART

Prior art provides a number of examples of semiconductor-based read-only memories with electrical addressing in passive matrix. Thus U.S. Pat. No. 4,099,260 (Lynes & al.) discloses a semiconductor-based read-only memory (ROM) made as a large scale integrated device wherein self-isolating bit line surface areas of one conduction type are formed in a semiconductor substrate and directly in a bulk area in the opposite conduction type. Channel stop areas of the same conduction type as the bulk area are formed in the intervals between the bit line areas. Metallic word lines which lie above and are orthogonal to the bit line areas, are formed separately from these by means of an isolating layer. The memory cell comprises a single Schottky diode. A diode of this kind will be formed or not at each intersection between a word line and a bit line depending on whether or not an opening is formed in the isolating layer during manufacturing in order to permit the word line to contact a lightly doped portion of the bit line. A ROM of this kind is stated to have a small area, high speed, low power dissipation and low cost.

Further there are from U.S. Pat. No. 4,000,713 (Bauge & Mollier) known a device with semiconductor elements, such as Schottky diodes and transistors integrated in the form of a matrix on chips. The matrix may be custom designed in order to provide a desired function. For instance it may be used as AND or OR matrices in programmable logic arrays (PLA) or as read-only memories which are stated to have better properties with regard to storage density and power dissipation. A first electrode structure with parallel metal electrodes of somewhat different design is provided on a semiconductor substrate of for instance the p type. An oxide layer is provided on a semiconductor substrate and openings are formed in the oxide layer to provide anode contacts and cathode contacts via metallic lines which constitute a first metal level in the electrode matrix. Two $n^+$ areas are located under the cathode contacts. These areas extend to underlying collector layers such that a Schottky diode is formed. Above the first metal level or electrode level an isolating layer is provided and over this a second metal level which comprises for instance an orthogonal second electrode structure. Openings through the isolating layer ensure contact with a cathode contact in a group of such which are included in the separate element in the matrix.

Finally there are from U.S. Pat. No. 5,272,370 (French) known a thin-film ROM device based on a matrix of open and closed memory cells formed in a stack of thin films on glass or another substrate. Each closed memory cell comprises a thin-film diode and it may by using stacks of semiconductor films, for instance of hydrogenated amorphous silicon, wherein the separate films are of different conduction types, be obtained diodes with different conduction characteristics. Thereby the information content in the ROM matrix may be increased. Each memory element which is formed with diode structure, may then be set with different logic levels according to some manufacturing protocol. Where the memory element does not have a diode structure or where the semiconductors are covered by an isolating layer such that no electrode contact is formed, the memory element may be used to form a determined first logic level, for instance logical 0.

Even though the above-mentioned prior-art devices all realize electrical addressing in passive matrix in an as per se known manner by providing diode junctions in closed electrode contacts, they have partly due to using different types of semiconductors a relatively high degree of complexity. In the ROM device as disclosed in the last-mentioned publication (U.S. Pat. No. 5,272,370) it may, however, be possible to store more than two logical values in the matrix, but this presupposes use of different diode types and hence several layers of differently doped semiconductors in the bit spot with diode junction.

BRIEF SUMMARY OF THE INVENTION

The object of the present invention is hence primarily to provide a read-only memory or ROM which permits electrical addressing in passive matrix to the separate memory cell in the read-only memory and which does not need refreshment in order to keep the data stored in the memory cell, while the read-only memory shall be simply and cheaply realized using as per se known technologies and methods as applied in the semiconductor and thin-film technology.

Particularly it is the object of the present invention to provide a non-volatile read-only memory based on the use of organic materials, for instance polymer materials, which realized in thin-film technology may be used both in conductors, isolators and semiconductor materials, something which supposedly shall provide more flexible technical solutions and especially a much reduced cost than would be the case when using crystalline inorganic semiconductors.

Further it is also an object to provide a read-only memory which allows a multilevel coding of predetermined memory cells or memory locations.

Finally it is the object of the present invention to provide a read-only memory which may be used to realize a volumetric read-only memory device.

These and other objects and advantages are achieved according to the invention with a read-only memory which is characterized in that a first logic state of a memory cell in the read-only memory is formed by an active portion of the semiconductor material covering the whole contact area in the memory cell, the diode junction comprising the whole contact area of the memory cell, that a second logic state in a selected memory cell in the read-only memory is formed by at least one electrode structure in the memory cell being covered by the isolating material, that one or several additional logic states in a memory cell in the read-only memory is formed by an active portion of the semiconductor material covering only a part of the contact area and/or that the diode junction only comprises a part of the contact area, such that the data which are stored in the memory may be represented by the logic states in a binary or multi-valued code, and that a logic state in each case is given by the impedance value of the memory cell, said impedance value substantially being given by one of the following factors: the impedance characteristics of the semiconductor material, the impedance characteristics of the isolating material, the extension of the active portion of the semiconductor material, the extension of the part of the contact area which forms the diode junction, and the impedance characteristic of the diode junction.

A first read-only memory device according to the invention is characterized in that the read-only memory is provided on a substrate of semiconductor material or between substrates of semiconductor material and via the substrates connected with driver and control circuits for driving and addressing, said driving and control circuits being integrated in the substrate or the substrates and realized in a semiconductor technology compatible with the substrate material; and a second read-only memory device according to the invention is characterized in that the read-only memory is stacked in horizontal layers in order to provide a volumetric memory device, that the volumetric memory device is provided on a substrate of semiconductor material or between substrates of semiconductor material and via the substrate or the substrates connected with driver and control circuits for driving and addressing, said driving and control circuits being integrated with the substrate or the substrates and realized in a semiconductor technology compatible with the substrate material.

Wherein the read-only memory according to the invention constitutes a binary logic memory with only one additional logic state, it is advantageous that the first logic state which either represents a logical 0 or a logical 1, is given by the effective forward bias resistance of a diode formed in a memory cell wherein the semiconductor material contacts both the x electrode and the y electrode, and that additional logic state which correspondingly represents either a logical 1 or a logical 0 is given by a selected resistance value for the isolating material provided in a memory cell wherein the semiconducting material at most contacts either the x electrode or the y electrode, said isolating material in a memory cell preferably having an infinite resistance value.

Wherein the read-only memory according to the invention is realized as a multilevel logic memory with two or more further logic states, it is advantageous that the first logic state is given by the effective forward bias resistance of a diode formed in a memory cell wherein the semiconductor material contacts both the x and y electrodes and that the additional logic states are given by determined resistance values for the isolating material provided in a memory cell wherein the semiconductor material at most contacts either the x electrode or the y electrode and the selected determined resistance value in each case lies between the effective forward bias resistance of a memory cell formed in the diode, and infinite.

In a first embodiment of the read-only memory according to the invention the isolating material in selected memory cells is provided between the electrode structures in the form of a separate layer-like isolator patch which wholly or partly covers at least one of the electrodes in the memory cell, a selected memory cell dependent on the active portion of the semiconductor material and/or the diode junction part of the contact area in the latter case acquiring a logic state which corresponds to a level of a multi-valued code.

If the isolator patch in said first embodiment wholly or partly covers only one of the electrodes, the semiconductor material may be provided between the electrode structures in a global layer and besides over the isolator patch in the selected memory cells. If the isolator patch wholly or partly covers both electrodes, the semiconductor material may preferably be provided between the electrode structures and adjacent to the isolator patches in the selected memory cells, such that semiconductor material and the isolator patches mutually flush in a common continuous layer.

In a second embodiment of the read-only memory according to the invention the isolating layer is provided between the electrode structures in the form of a substantially global layer which covers at least one of the electrode structures and with removed portions in selected memory cells, such that removed portion wholly or partly exposes the electrodes in a selected memory cell, said memory cell dependent on the active portion of the semiconductor material and/or the diode junction part of the contact area in the latter case acquiring a logic state which corresponds to a level in a multi-valued code.

If the isolating layer in said second embodiment covers only one of the electrode structures, the semiconductor material may preferably be provided between the electrode structures and over the isolating layer in a global layer and besides contact the electrode structures in the removed portions of the isolation layer. If the isolating layer covers both the electrode structures, the semiconductor material may preferably be provided only between the electrode structures and adjacent to the isolation layer in the selected memory cells, such that the semiconductor material and the isolating layer mutually flush in a common continuous layer. Finally, it is according to the invention advantageous that the semiconductor material is amorphous silicon, polycrystalline silicon or an organic semiconductor, said organic semiconductor preferably being a conjugated polymer.

According to the invention the semiconductor material may be an anisotropic conductor. Preferably the semiconductor material may comprise more than one semiconductor or possibly also be added or combined with an electrical conducting material.

Preferably the semiconductor material, the isolating material and the electrode structures are realized as thin films.

The background of the invention and various examples of its embodiment shall now be discussed in more detail in the following with the reference to the accompanying drawing.

DETAILED DESCRIPTION OF THE INVENTION

Figure 1:
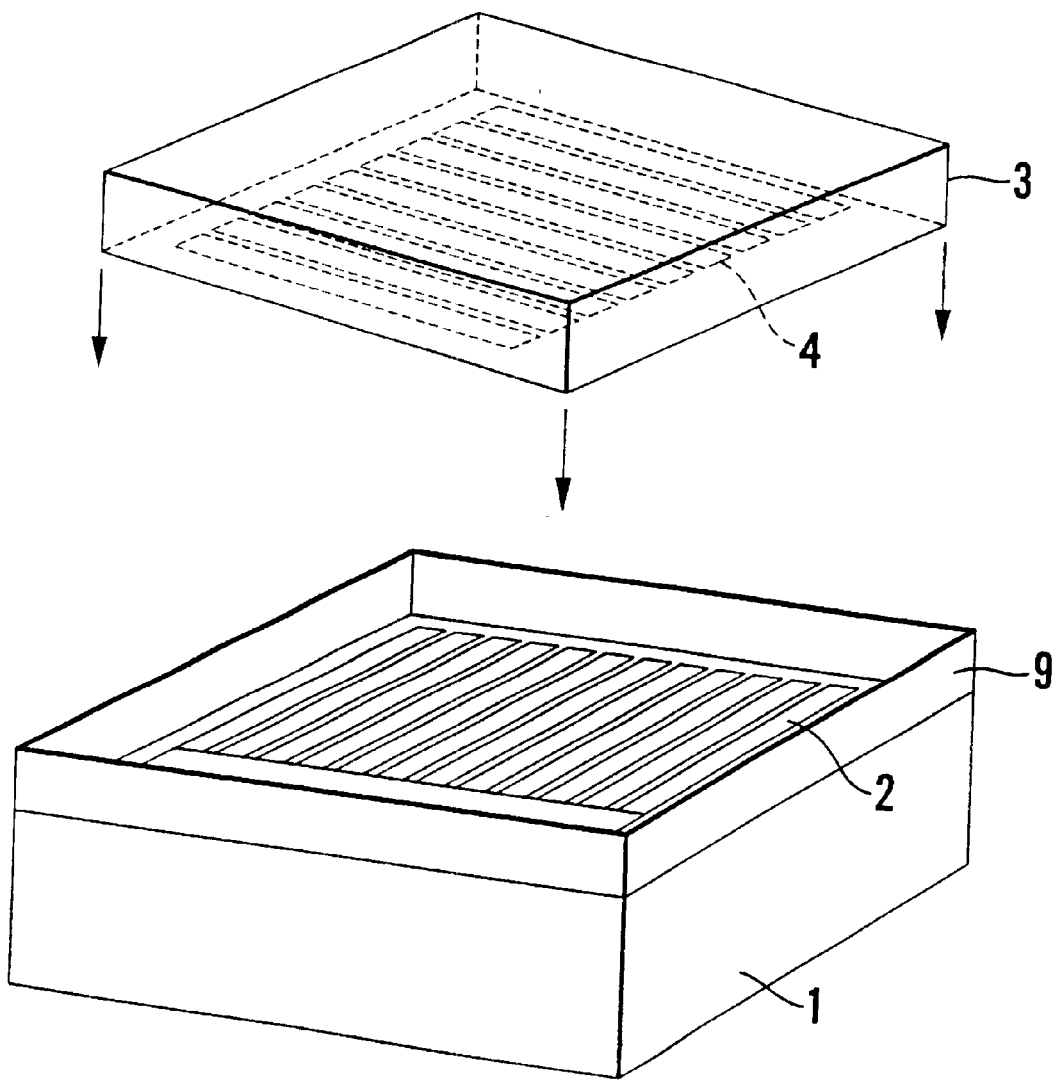
FIG. 1 shows schematically a general embodiment of a memory device with a passive electrode matrix provided between backplanes or substrates, FIG. 2 schematic examples of sneak current loops which may arise in a matrix of this kind, FIG. 3a a first embodiment of a read-only memory according to the invention and seen in plan view, FIG. 3b a section through the read-only memory in FIG. 3a taken along the line A—A in a first variant of this embodiment, FIG. 3c a section through the read-only memory in FIG. 3a taken along the line A—A in a second variant of this embodiment, FIG. 4a a second embodiment of the read-only memory according to the invention seen in plan view, FIG. 4b a section through the read-only memory in FIG. 4a taken along the line A—A in a first variant of this embodiment, FIG. 4c a section through the read-only memory in FIG. 4a taken along the line A—A in a second variant of this embodiment FIG. 5a an example of multilevel coding of a memory cell in the embodiment in FIG. 3a, FIG. 5b a section through the memory cell in FIG. 5a taken along the line B—B, FIG. 6a an example of multilevel coding of a memory cell in the embodiment in FIG. 4a, FIG. 6b a section through the memory cell in FIG. 6a taken along the line B—B, FIG. 7 a sectional view through a first read-only memory device according to the invention, and FIG. 8 a sectional view through a second read-only memory device according to the invention.

The general background of the invention shall now be discussed more closely. A generic matrix addressing system is shown in FIG. 1, wherein for instance m electrical conducting lines 2 are mutually spaced apart and extend in a x direction and with for instance n overlying electrical lines 4 which extend in a y direction and respectively form first and second electrode structures in an orthogonal x,y electrode matrix. The x electrodes 2 and the y electrodes 4 are provided sufficiently close to each other such that geometrically well-defined overlapping areas or intersections between the electrodes are provided. The volume near and between each intersection, coarsely defined by the overlapping area which is given by the width of the intersecting x electrodes and the y electrodes in these intersections, comprises what in the following will be denoted as a memory cell 5, see FIG. 2. The mutually overlapping areas of respectively the x and the y electrodes 2;4, in a memory cell 5 will be denoted as the contact area of the memory cell. According to the invention data is stored in each memory cell as impedance values, for instance resistance values between the x and the y electrode in each intersection. The logic state in each intersection or memory location is found by measuring electrical impedance between the x electrode and the y electrode which intersect each other in the memory cell.

Figure 2:
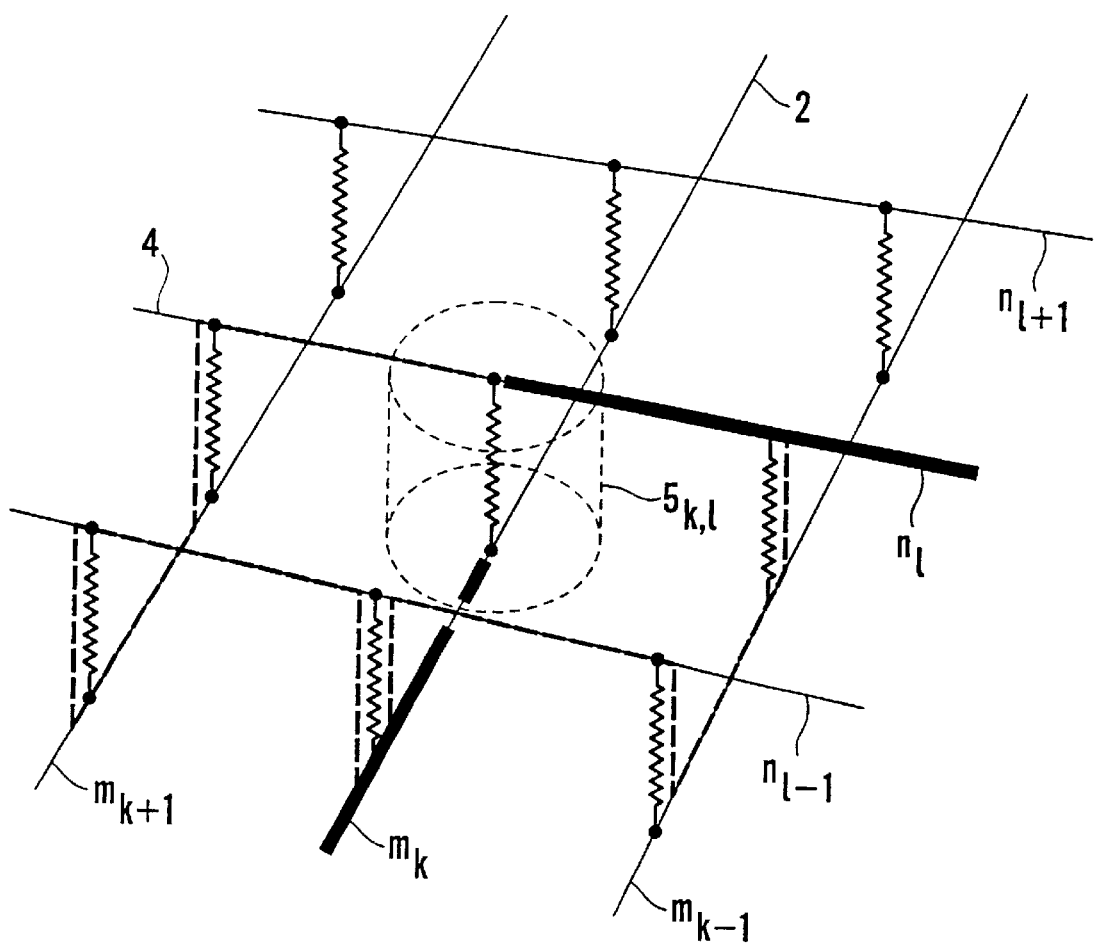

Distinct from common known current-addressed and matrix-based memory systems the present invention allows the use of a purely passive electrical addressing, as there are no discrete active circuit elements in the memory cells. It is well-known that the use of electronic memories with memory cells in passive matrix is encumbered with alternative current paths or sneak current paths in the electrode matrix. This problem is indicated in FIG. 2 where alternative current paths generated by addressing the memory cell $5_{kl}$ given by the intersection between the electrodes $m_k$, $n_l$ are indicated by thinner stitched lines to the neighbouring memory cells. When the size of the matrix, i.e. the product x·y increases, then the sneak current problem also amplifies. If the memory elements in each intersection has a purely resistive impedance this implicates that the resistance difference in a write operation will be masked by currents which leak through alternative current paths, such as indicated in FIG. 2. If the electrical connection in each intersection is given a highly non-linear current-voltage characteristic, the sneak current problem may be reduced or wholly eliminated. Quite simply this is achieved in a manner which is already well-known and suggested in the art, namely by providing a rectifying diode in series with the impedance or resistance in each intersection.

An essential goal of the present invention is forming a network of diodes of this kind in a manner which simple, cheap, reliable and which simultaneously allows the use of suitable memory structures in the form of controllable impedances. According to the present invention the x and the y electrodes may preferably surround a layer of semiconducting material, for instance in thin-film configuration. Particularly this semiconducting material may advantageously be a conjugated polymer of the thiophene or PPV-type. By choosing a suitable electrode material with regard to the semiconducting material, a diode junction is obtained at the electrode-semiconductor interface and the diode may be given very good rectifying properties. A simple linearized analysis shows that the number of electrode intersections, i.e. memory cells which may be addressed without distortion or noise due to sneak currents, is approximately equal to the diode rectification ratio in each intersection, i.e. the relation between forward and backwards flowing current at a given bias voltage.

Another basic problem with passive matrix memories as exemplified in FIG. 1 wherein the continuous material layer with finite resistance extends in the intervals between the intersections of the electrode matrix, is that currents even with perfect rectification in each intersection may flow between the electrode lines 2, 4 in these intervals. Even if the path length in these intervals will be much longer than which is the case in the intersections, i.e. in the memory cell, and the layer between the electrode structures are extremely thin with high surface resistance, the combined effect of many such current paths is detrimental to the measured impedance and hence finally sets an upper limit to the number of intersections and so also of memory cells which may be realized in a passive matrix.

The last kind of crosstalk may be avoided by making the film conductance highly anisotropic, i.e. with high conductance in the desired current direction and else low conductance. In case of FIG. 1 this will correspond to high conductance perpendicularly to the plane of the matrix and low conductance in the matrix plane. Polymer compositions with properties of this kind have been described in the literature, for instance in the paper "White light emission from a polymer blend light emitting diode" of M. Granström and O. Inganäs, Applied Physics Letters 68, 2:147–149 (1996), and electrode means and devices based thereon have been disclosed in NO patent application No. 973390 which has been assigned to the present applicant.

Starting with an as per se known basic structure as shown in FIG. 1 wherein the x and y electrodes 2;4 are provided on each side of an anisotropic thin film with high rectification ratio in the intersections of the electrodes, data may be coded by a controlled deposition of an electrical isolating material between diodes in selected intersections, such this will be discussed in more detail in connection with FIG. 3a. If such selected intersections are given an infinite resistance, each intersection or each memory cell can be binary coded, for instance with a forward bias voltage which either gives logical 1 as R=$R_F$, where $R_F$ is the effective forwards bias resistance of the diode in this intersection, or logic 0 as R=∞, where an infinite resistance on purpose have been inserted in the intersection. Higher data storage capacity will be obtained by using a larger range of resistance values, which is equivalent to several bits being stored in each memory cell, for instance with resistance values $R_1$, $R_2$, $R_3$, ..., $R_F$<$R_1$<$R_2$<$R_3$<∞.

A first embodiment of the read-only memory according to the invention shall now be described with reference to FIGS. 3a–3c. In this case the as per se known the generic structure as shown in the figure is formed by depositing the x electrodes at the bottom substrate 1 or backplane which may be made of a semiconducting 2 material and comprises active circuits for signal processing, routing and logic manipulation integrated with the x electrodes 2 which here form a first electrode structure in the electrode matrix. Correspondingly a top substrate 3 may integrate circuits with the y electrodes 4 in the same manner and for corresponding purposes. It shall be understood that the x electrodes 2 and the y electrodes 4 may be used for forming for instance bit lines and word lines in the read-only memory according to the invention. Both substrates 1;3 with circuits and electrodes 2;4 are processed by means of standard semiconductor technologies and it may for instance be used a crystalline semiconductor wafer, for instance of silicon, as substrate. Alternatively, the silicon may consist of amorphous silicon or semiconducting organic materials on rigid or flexible supports (backplanes). In a following step may now either one of the substrates 2;4 or both 2,4 be coded such that the resulting read-only memory receives the desired information content. Advantageously this is done by providing localized isolator or resistor films 6 in the form of patches 7 over the electrodes 2;4 on one of the substrates 1;3, such that they will be positioned in the intersection between an x electrode and a y electrode. Materials which are common in the solid state technology may be used and likewise well-known technologies for depositing and adjustment. Over the isolator patches on the resistor patches 7 a global semiconductor layer 9 is now for instance deposited such as shown in FIG. 3b ( the semiconductor layer 9 is for the sake of clarity deleted from FIG. 3a), which simultaneously forms a diode junction with the electrode material in one of the electrode structures, for instance the y electrodes 2. The chosen semiconductor material and the chosen material in the electrode structure may be such that where the exposed portions of the electrode structures physically contact the semiconductor material, rectifying junctions or diode junctions are spontaneously formed.

The semiconductor material used must have suitable rectifying and conducting properties, while it is desirable with low bulk cost, simple processing, a long lifetime etc. and must be such that optimal contact to the material of the electrode structures is obtained. As semiconductor material may for instance conjugated polymers of either the PPV or thiophene families be suitable. Alternatively amorphous silicon or polycrystalline silicon may be used together with an anisotropic conducting thin film of plastic material.

The basic procedure of the manufacture requires a precision adjustment when the isolator patches 7 is deposited on the electrodes 2;4. This step may, however, easily be implemented with a direct extension of manufacturing processes for active circuits with electrode matrices. Global deposition of semiconductor film 9 such as it is shown in FIG. 3b, may be performed without any kind of precision adjustment. The y electrode 4 must, however be provided in such manner that the isolator patches 7 are located in the intersections between the electrode structures. This requires a higher positioning accuracy the closer the intersections are provided. In that connection the use of a transparent top substrate 3 with semiconductor circuits based on organic semiconductors or amorphous silicon in combination with thin film of semiconductor polymer may offer possibilities for an adjustment which cannot be achieved by using non-transparent substrates of crystalline silicon. In the embodiment in FIG. 3a the resistance values of the isolator patches 7 may be varied by using different isolating materials, possibly by varying the thickness or the form of the isolator patches. It is hence very well possible to obtain a multilevel coding such that for instance the memory cell 5 in an intersection wherein no isolator patch 7 has been provided, may represent a logical 0 while further logical values may be stored in memory cells wherein isolator patches with varying geometry or made of materials with different resistance values are used. In a purely binary coding the impedance values of all isolator patches will of course be the same. They may then all be made with infinite resistance. A particularly preferred method to obtain binary coding in the embodiment shown in FIGS. 3a–c shall also be discussed below in connection with FIGS. 5a and 5b. If the isolator patches 7 have the same thickness, the semiconductor layer 9 may as shown in FIG. 3c be provided between the electrodes 2, 4 such that they are flush with the surface of the isolator patches 7. This may entail further advantages with regard to eliminate and reduce stray currents and stray capacitances. In the variant embodiment in FIG. 3b stray capacitances may arise or stray currents may flow to the semiconductor bulk material 9. This may, however, be eliminated by using an anisotropic semiconductor as the semiconductor material, the conduction direction of which extends between the electrode structures. If, however, the semiconductor layer 9 is flush with the surface of the isolator patch 7 as shown in FIG. 3c, which is expedient when the isolator patches have the same thickness, the distance between the electrode structures may be reduced and the semiconductor layer generally be made much thinner, such that the semiconductor material does not need to be anisotropic conducting, while possible bulk currents simultaneously are strongly reduced. The diode junction between the semiconductor material and one of the electrode structures will, of course, simultaneously be maintained and reduce or eliminate the danger for sneak currents via the electrode structures.

Figure 3A:
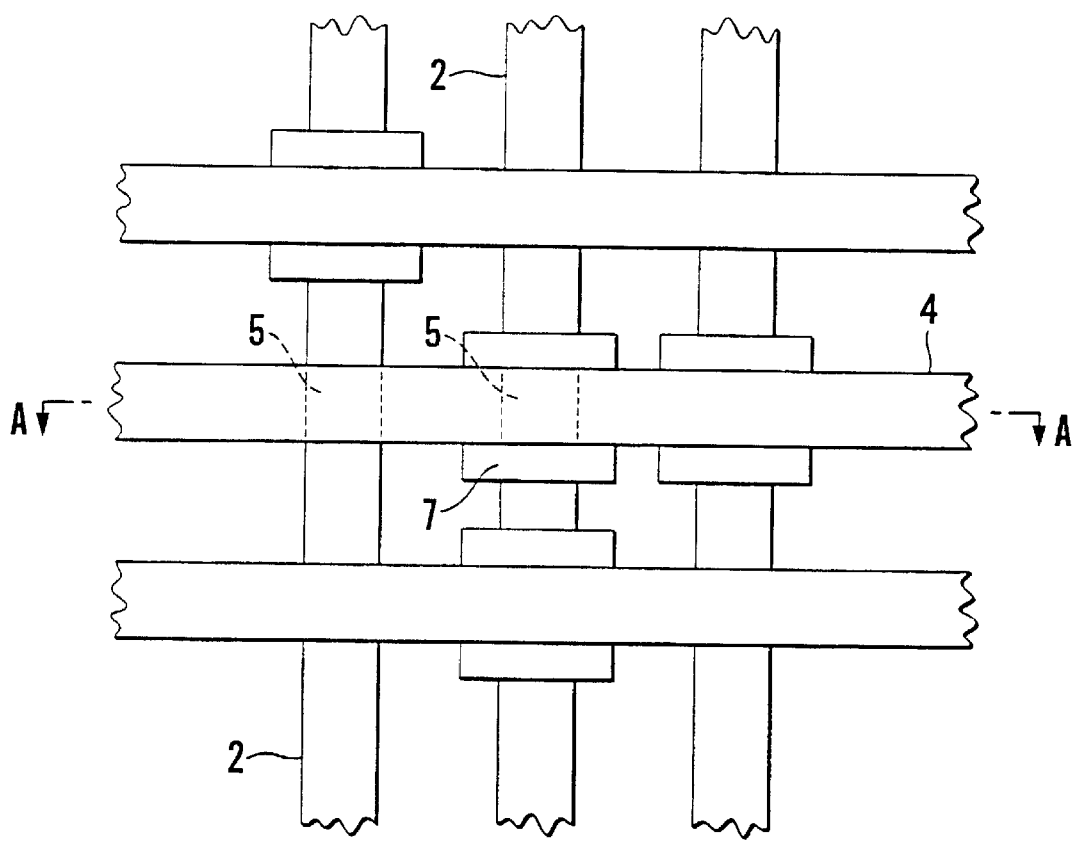
Figure 4C:
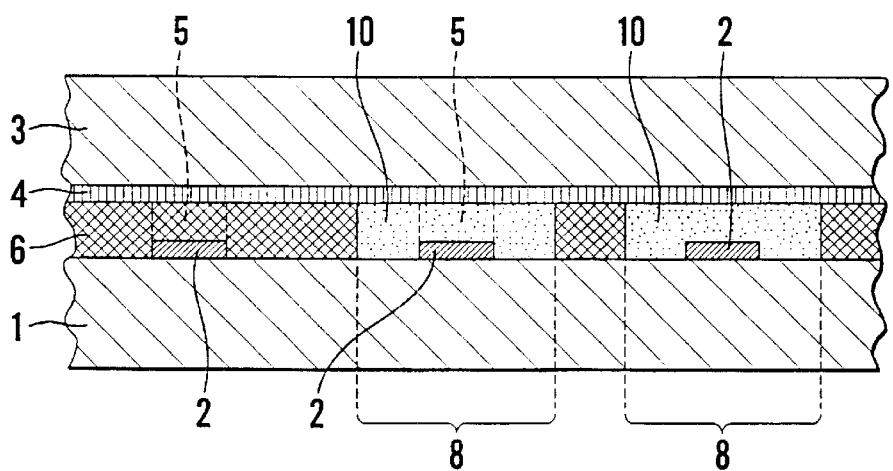
Figure 4A:
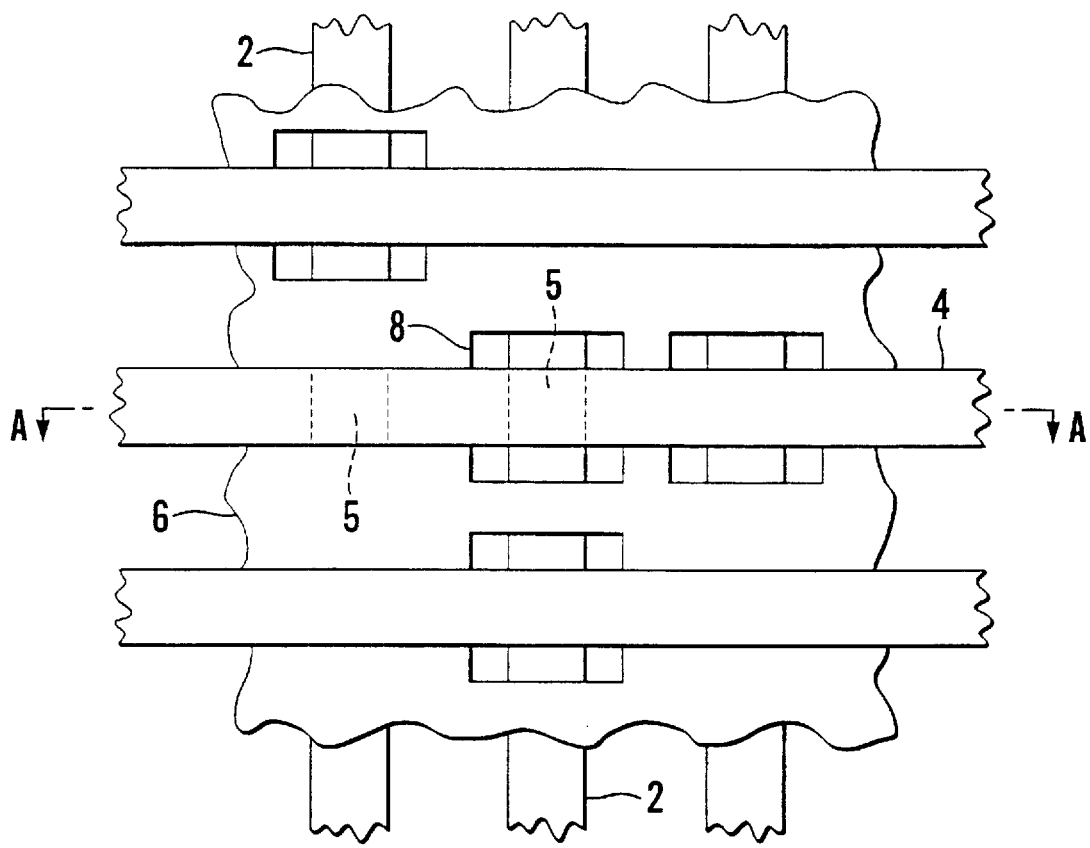
Figure 4B:
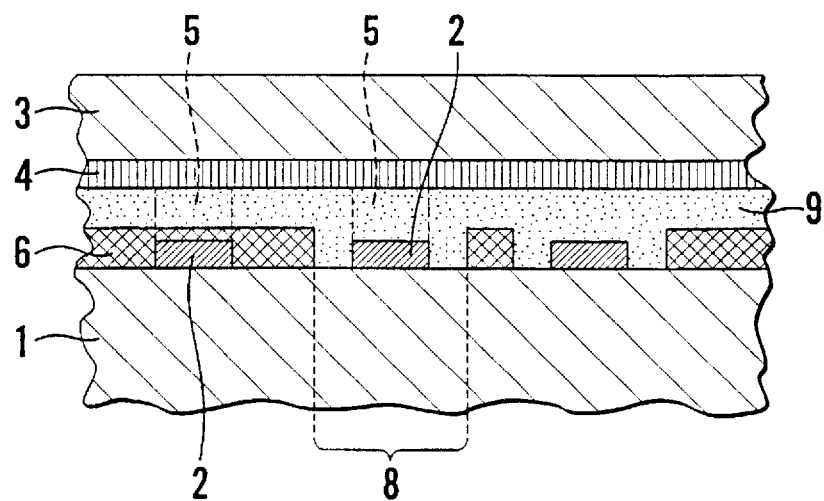

FIGS. 4a and 4b show respectively in plan view and in section taken along the line A—A in FIG. 4a another embodiment of the read-only memory according to the invention (the semiconductor layer 9 also here deleted from FIG. 4a). The electrode structures are as before deposited on respective bottom and top substrates 1;3, but an isolating layer 6 is now deposited over the electrodes 2, 4 and between the electrode structures and over one of them as a substantially global layer, but with removed portions 8 in predetermined intersections for the purpose of forming therein memory cells 5 which store other logical values. A semiconductor material 9 which now is deposited over the top of the isolating layer 6, see FIG. 4b, will of course only contact both electrode structures in the removed portions 8 or "windows" in the isolating layer 6, such that the memory cells 5 at these removed portions for instance may store a binary logical value 0, while the memory cells 5 wherein one of the electrode structures is covered by the isolating layer 6, stores a binary logical value 1. Similarly to the embodiment shown in FIG. 3a, also here the semiconductor material 9 may be provided such that it is flush with the isolating layer 6, i.e. it will only be located in the removed portions 8 or the windows with the above-mentioned advantages resulting therefrom, such this is disclosed in FIG. 4c, where the semiconductor material is shown as a "patch" 10 over an electrode 2. The manufacturing step for the embodiment in FIGS. 4a–c may shortly be summed up as comprising depositing of x electrodes on the substrate 1, applying a substantial global isolating layer 6 coded with removed portions 8 or windows and thereabove applying a global semiconductor layer 9, while the y electrodes 4 is deposited on the top substrate 3, whereafter the top substrates 1,3 with deposited electrodes 2, 4 isolating layer 6 and semiconductor layer 9 are joined into a sandwich structure. An advantage of the embodiment shown in FIGS. 4a–4b, is that the semiconductor does not need to be an anisotropic semiconductor, while simultaneously stray currents and sneak currents outside the intersections between the electrodes substantially will be completely eliminated. In addition sneak currents through the diode junctions are reduced, as current only will flow where a window is located in the isolating layer. A restriction to the use of binary coding only makes it possible to increase the data storage density by reducing the horizontal distance between the electrodes in each electrode structure, such that area density of the memory cells increases. Typically the sneak current background will be halved in a binary coding scheme with one half zeros and one half ones, and this will allow that the number of memory cells or intersections in the electrode matrix may be doubled with maintenance of the same basic signal-to-noise ratio in the addressing (reading). Also in the embodiment in FIGS. 4a–c logical values based on a multilevel code may be stored, such this will be explained more closely in the following with reference to FIGS. 6a and 6b.

Figure 3B:
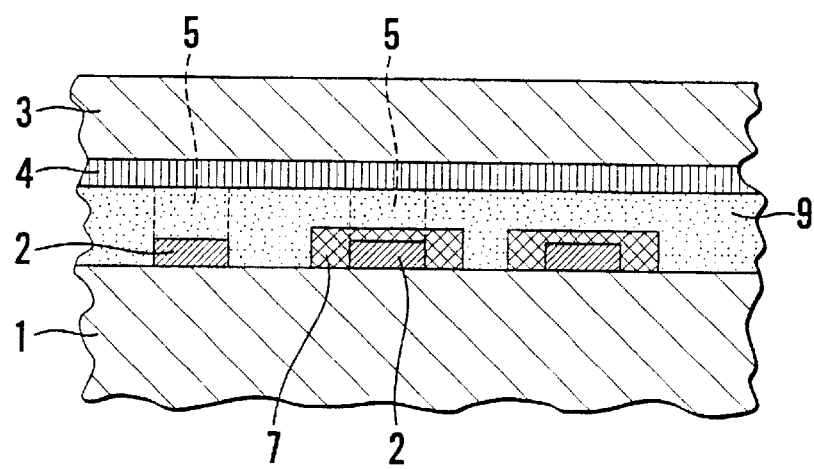
Figure 3C:
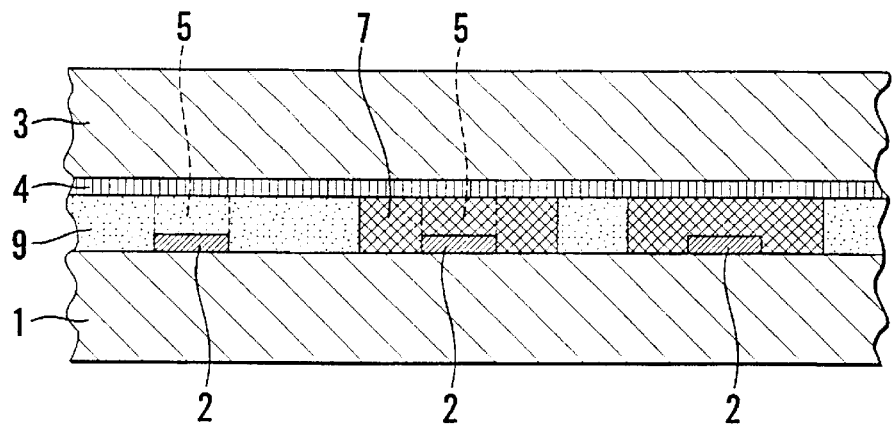

FIGS. 5a and 5b show in plan view and in section a memory cell in the embodiment of the read-only memory as shown in FIGS. 3a and 3c. The isolator patch 7 which codes the memory cell 5 is here realized such that it isolates only a part of the contact area in each memory cell, in contrast with the embodiment shown in FIG. 3a, where for instance the isolator patch 7 isolates the whole contact area 11. As before the semiconductor material 9 is provided between the electrodes 2, 4 above the isolator patch 7 and as before a diode junction is formed between one of the electrodes 2, 4 in the memory cell 5 and the semiconductor material 9. The diode junction may for instance in the embodiment in FIG. 3b be identical with the contact area 11, but if semiconductor layers 9 flush with the isolator patches 7 are used, as in FIG. 3c, the area of the diode junction will of course be reduced to that part which is not covered by the isolator patch 7. The effective conductor cross section and the bulk impedance in the semiconductor material will in thin semiconductor layers or anisotropic semiconductor layers depend on the effective contact area which in FIGS. 5a, 5b is limited to that part of the electrode 2, 4 which is not covered by the isolator patch 7. This effective contact area which may be different from the area of the diode junction, defines an active portion in the semiconductor between the electrodes 2, 4. By using isolator patches of different size for coding the memory cells, it may in this manner suitably be stored data in a multi value code.

A coding of the memory cells 5 in the embodiment in FIGS. 4a–4c takes place in inverse analogy with the method shown in FIGS. 5a and 5b, as now it is, as shown in FIG. 5a, the extension of the removed portions 7 or windows in the isolating layer 6 which determines the effective contact area in the memory cell 5 and if the variant in FIG. 4c is used, also the diode junction part of the contact area. The semiconductor material 10 which is provided over for instance the x electrode 2 in the memory cell 5, hence has its bulk impedance reduced substantially in correspondence with the reduction in the effective contact area and by varying the size of the window 8 in the isolating layer 6 in this manner and hence the effective contact area, data may be stored in the memory cells with the use of a multi-valued code.

It shall here be remarked that coding of data with use of multi-valued code places greater demand on discrimination when reading the impedance value in a memory cell and if there is a present danger of bulk and sneak currents masking the impedance value signal, either the mutual distance between the electrodes 2, 4 in each electrode structure and hence the memory cells 5 may be increased or else the multi-valued code may be employed with the embodiment variants shown in respectively FIG. 3c and FIG. 4c, which easily will allow the memory cells to be located with a great area density and with maintenance of the discrimination which will be necessary to obtain a readout of the data stored for instance in a two-bit code, i.e. with two levels between the code level given by respectively a complete masking of the contact area in the memory cell and a complete exposure of the contact area in the memory cell. It is, however, supposed that it will be possible to increase the number of levels in the code, for instance using three- or four-bit coding. The latter is represented by sixteen levels and hence the realization will be a question of dimensions and achievable pitch if the manufacture of the memory cells takes place with conventional micro-photolithographic methods.

It may be expedient to form the semiconductor material from several semiconductors, for instance provided in layers, such as known in the art, in order to obtain special types of diodes, such as also known in the art, or in order to vary the impedance characteristics. For the same purpose also the semiconductor material may be combined with or added an electrical conducting material.

Figure 7:
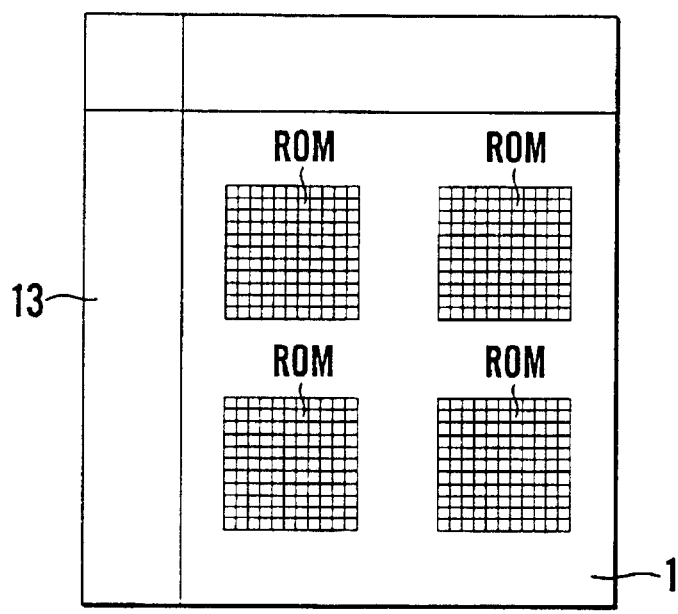
Figure 8:
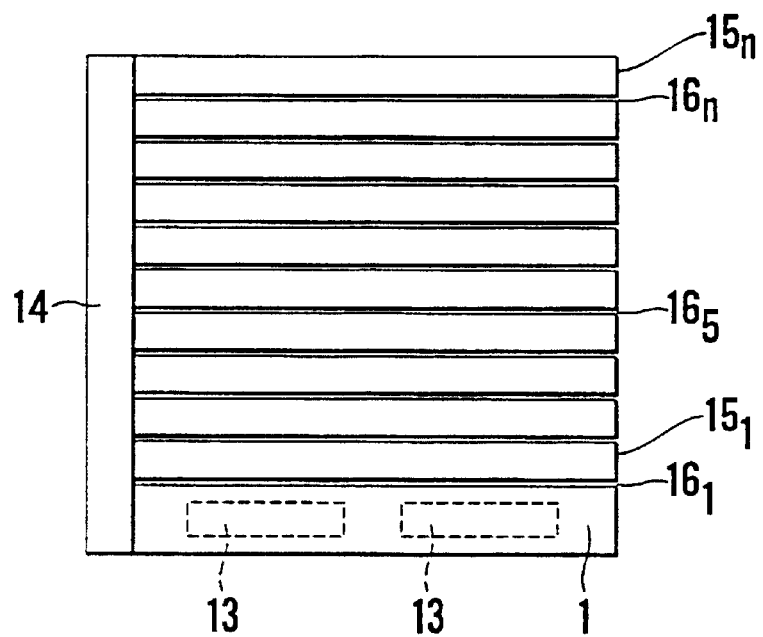

One or more read-only memories ROM according to the invention may advantageously be provided on a semiconductor substrate 1 of for instance silicon. In this substrate or integrated therewith in a compatible semiconductor technology there may be provided driver and control circuits 13 for the read-only memory. An embodiment with four read-only memories ROM provided for instance on a silicon substrate 1 with integrated driver and control circuits 13 is shown in FIG. 7. Instead of providing the read-only memories in a planar configuration, they may also be stacked vertically in layers, such as is shown in FIG. 8. Once again the semiconductor substrate 1 of for instance silicon integrated with driver and control circuits 13, is used. Along the side edges of a stacked memory device of this kind there may be provided addressing and driver buses 14 and in order to connect the electrodes in the respective electrode structure, i.e. the electrode matrix, to the driver and control circuits in silicon substrates as this is indicated in FIG. 7 which shows an embodiment with stacked read-only memories ROM 15$_l$. . . 15$_n$ which mutually are isolated by isolating layers 16$_l$. . . 16$_n$, for instance ceramic.

Read-only memories and read-only memory devices according to the invention could advantageously be realized in card format compatible with standard interfaces as commonly used with personal computers. In practice the read-only memory realized in a read-only memory device may be implemented in known thin-film technology and the read-only memory device will integrated with the silicon substrate appear as hybrid device. In practice it has turned out that read-only memories according to the invention may be made with a thickness of electrode structures and memory cells of at most a few micrometers and with realistically at least two memory cells per $\mu m^2$ with the use of present technology, A read-only memory with one storage layer and an area of 1 cm$^2$ will hence store 25 Mbyte with binary coding. By using two- or four-bit coding, something which seems realistic, the data storage density may, of course, be correspondingly increased. It is assumed that it also will be realistic to reduce the size of the memory cells further such that a quadrupling of the storage density in this way may be achieved. It will hence be possible to store some hundred Mbytes in each read-only memory and the data storage density will, of course, increase proportionally with the number of stacked layers in a read-only memory device configured volumetrically.

Implemented with standard card interfaces for use in personal computers or in decoder devices for play-back equipment for reproducing sound and picture material it will hence be possible to employ the read-only memory according to the invention as data carrier for source material which else usually is stored on media such as CD-ROM.

Writing to the read-only memory according to the invention, i.e. input and coding of data, is implemented in and integrated with manufacturing processes. Preferably the read-only memory is manufactured with the use of well-known thin-film technologies and photolithographic methods. Basically all materials may be provided in global layers and electrode structures and patches and removed portions (windows) formed with the use of photomasks and etching. "Writing" of data then takes place by "coding" photomasks for patches or windows with positioning and dimensioning the patches or windows of the mask in accordance with a determined protocol, such that each memory cell is correctly coded. Processes of this kind may easily be implemented for manufacturing of large series of read-only memories with the same source information, for instance program material for music or films.

What is claimed is:

1. An electrically addressable non-volatile read-only memory, comprising a plurality of memory cells (5) which in a write operation comprising a part of the manufacturing process of the read-only memory, permanently each are assigned one or two or more logic states according to a determined protocol which in the memory defines permanently written or stored data, and a passive matrix of electrical conductors (2, 4) for the addressing wherein the passive electrical conductor matrix comprises a first and a second electrode structure in respective mutually spaced apart and parallel planes and with parallel electrodes (2, 4) in each plane provided such that the electrodes form a substantially orthogonal x,y matrix wherein the electrodes in the first electrode structure comprise the columns of the matrix or x electrodes and the electrodes (4) in the second electrode structure comprise the rows of the matrix or y electrodes, wherein at least a portion of the volume between the intersection of an x electrode (2) and a y electrode (4) defines a memory cell (5) in the read-only memory, wherein the mutually overlapping portions of the x electrode (2) and the y electrode (4) in the memory cell (5) each defines a contact area (11) in the memory cell (5), wherein at least one semiconductor material (9) is provided between the electrode structures and with rectifying properties in relation to a selected electrical conducting electrode material, and an electrical isolating material (6), wherein the semiconductor material (9) in electrical contact with an electrode (2, 4) in the memory cell forms a diode junction in the interface between semiconductor material and electrode material, wherein a first logic state of a memory cell (5) in the read-only memory is formed by an active portion of the semiconductor material (9) covering the whole contact area (11) in the memory cell, said active portion of the semiconductor material (9) including an extension, the diode junction comprising the whole contact area of the memory cell, wherein a second logic state in a selected memory cell (5) in the read-only memory is formed by at least one electrode structure in the memory cell being covered by the isolating material (6), and wherein a logic state in each case is given by the impedance value of the memory cell (5), said impedance value substantially being given by one or more of the following factors: the impedance characteristics of the semiconductor material, the impedance characteristics of the isolating material, and the impedance characteristic of the diode junction, characterized in that one or more additional logic states in a memory cell (5) in the read-only memory is formed by an active portion of the semiconductor material (9) covering a part of the contact area (11) such that the data which are stored in the memory may be represented by the logic states in a multi-valued code, and that said one or more additional logic states are given by impedance values determined by the extension of the active portion of the semiconductor material.

2. A read-only memory according to claim 1, wherein the read-only memory constitutes a binary logic memory with only one additional logic state, characterized in that the first logic state which either represents a logical 0 or a logical 1, is given by the effective forward bias resistance of a diode formed in a memory cell (5) wherein the semiconductor material (9) contacts both the x electrode (2) and the y electrode (4), and that additional logic states which correspondingly represent either a logical 1 or a logical 0 are given by a selected resistance value for the isolating material (6) provided in a memory cell (5) wherein the semiconductor material (9) at most contacts either the x electrode (2) or the y electrode (4).

3. A read-only memory according to claim 2, characterized in that the isolating material (6) in a memory cell has a resistance value approching infinity.

4. A read-only memory according to claim 1, wherein the read-only memory is realized as a multilevel logic memory with two or several further logic states, characterized in that the first logic state is given by the effective forward bias resistance of a diode formed in a memory cell (5) wherein the semiconductor material (9) contacts both the x and the y electrodes (2,4) and that the additional logic states are given determined resistance values for the isolating material (6) provided in a memory cell (5) wherein the semiconductor material (9) at most contacts either the x electrode (2) or the y electrode (4) and the selected determined resistance value in each case lies between the effective forward bias resistance of a memory cell (5) formed with a diode, and a value approaching infinity.

5. A read-only memory according to claim 1, characterized in that the isolating material (6) in selected memory cells (5) is provided between the electrode structure in the form of a separate layer-like isolator patch (7) which wholly or partly covers at least one of the electrodes (2,4) in the memory cell (5), a selected memory cell dependent on the active portion of the semiconductor material and/or the diode junction part of the contact area in the latter case acquiring a logic state which corresponds to a level in a multi-valued code.

6. A read-only memory according to claim 5, wherein the isolator patch (7) wholly or partly covers only one of the electrodes (2, 4), characterized in that the semiconductor material (9) is provided between the electrode structures in a global layer and besides over the isolator patches (7) in the selected memory cells (5).

7. A read-only memory according to claim 5, wherein the isolator patch (7) wholly or partly covers both electrodes (2, 4), characterized in that the semiconductor material (9) is provided only between the electrode structures and adjacent to the isolator patches (7) in the selected memory cells (5), such that the semiconductor material (9) and isolator patches (7) mutually flush in a common continuous layer.

8. A read-only memory according to claim 1, characterized in that the isolating material (6) is provided between the electrode structures in the form of a substantially global layer which covers at least one of the electrode structures and with removed portions (8) in selected memory cells (5), such that the removed portion wholly or partly exposes the electrodes (2, 4) in a selected memory cell (5), said memory cell dependent on the active portion of the semiconductor material (9) and for the diode junction part of the contact area (11) in the latter case acquiring a logic state which corresponds to a level in a multi-valued code.

9. A read-only memory according to claim 8, wherein the isolating layer (6) covers only one of the electrode structures, characterized in that the semiconductor material (6) is provided between the electrode structures and over the isolating layer (6) in a global layer and besides contacts the electrode structures in the removed portions of the isolating layer (6).

10. A read-only memory according to claim 8, wherein the isolating layer (6) covers both electrode structures characterized in that the semiconductor material (9, 10) is provided only between the electrode structures and adjacent to the isolating layer (6) in the selected memory cells (5), such that the semiconductor material (9, 10) and the isolating layer (6) mutually flush in a common continuous layer.

11. A read-only memory according to claim 1, characterized in that the semiconductor material (9) is amorphous silicon.

12. A read-only memory according to claim 1, characterized in that the semiconductor material (9) is polycrystalline silicon.

13. A read-only memory according to claim 1, characterized in that the semiconductor material (9) is an organic semiconductor.

14. A read-only memory according to claim 13, characterized in that the organic semiconductor (9) is a conjugated polymer.

15. A read-only memory according to claim 1, characterized in that the semiconductor material (9) is an anisotropic conductor.

16. A read-only memory according to claim 1, characterized in that the semiconductor material (9) comprises various materials having different properties.

17. A read-only memory according to claim 1, characterized in that the semiconductor material (9) has been added or combined with an electrical conducting material.

18. A read-only memory according to claim 1, characterized in that the semiconductor material (9), the isolating material (6) and the electrode structures are realized as thin films.

19. A read-only memory device comprising one or more read-only memories (ROM) according to claim 1, characterized in that the read-only memory (ROM) is provided on a substrate (1) semiconductor material and via the substrates connected with driver and control circuits (13) for driving and addressing, said driving and control circuits (13) being integrated in the substrate (1) and realized in a semiconductor technology compatible with the substrate material.

20. A read-only memory device comprising two or more read-only memories according to claim 1, characterized in that the read-only memory is stacked in horizontal layers (15) in order to provide a volumetric memory device, that the volumetric memory device is provided on a substrate (1) of semiconductor material and via the substrate or the substrates connected with driver and control circuits (13) for driving and addressing, said driving and control circuits (13) being integrated with the substrate (1) and realized in a semiconductor technology compatible with the substrate material.

21. A read-only memory device comprising one or more read-only memories (ROM) according to claim 1, characterized in that the read-only memory (ROM) is provided between substrates (1;3) of semiconductor material and via the substrates connected with driver and control circuits (13) for driving and addressing, said driving and control circuits (13) being integrated in the substrates (1;3) and realized in a semiconductor technology compatible with the substrate material.

22. A read-only memory device comprising two or more read-only memories according to claim 1, characterized in that the read-only memory is stacked in horizontal layers (15) in order to provide a volumetric memory device, that the volumetric memory device is provided between substrates (1;3) of semiconductor material and via the substrate or the substrates connected with driver and control circuits (13) for driving and addressing, said driving and control circuits (13) being integrated with the substrate (1) and realized in a semiconductor technology compatible with the substrate material.

23. An electrically addressable non-volatile read-only memory, comprising a plurality of memory cells (5) which in a write operation comprising a part of the manufacturing process of the read-only memory, permanently each are assigned one or two or more logic states according to a determined protocol which in the memory defines permanently written or stored data, and a passive matrix of electrical conductors (2, 4) for the addressing wherein the passive electrical conductor matrix comprises a first and a second electrode structure in respective mutually spaced apart and parallel planes and with parallel electrodes (2, 4) in each plane provided such that the electrodes form a substantially orthogonal x,y matrix wherein the electrodes in the first electrode structure comprise the columns of the matrix or x electrodes and the electrodes (4) in the second electrode structure comprise the rows of the matrix or y electrodes, wherein at least a portion of the volume between the intersection of an x electrode (2) and a y electrode (4) defines a memory cell (5) in the read-only memory, wherein the mutually overlapping portions of the x electrode (2) and the y electrode (4) in the memory cell (5) each defines a contact area (11) in the memory cell (5), wherein at least one semiconductor material (9) is provided between the electrode structures and with rectifying properties in relation to a selected electrical conducting electrode material, and an electrical isolating material (6), wherein the semiconductor material (9) in electrical contact with an electrode (2, 4) in the memory cell forms a diode junction in the interface between semiconductor material and electrode material, wherein a first logic state of a memory cell (5) in the read-only memory is formed by an active portion of the semiconductor material (9) covering the whole contact area (11) in the memory cell, said active portion of the semiconductor material (9) including an extension, the diode junction comprising the whole contact area of the memory cell, wherein a second logic state in a selected memory cell (5) in the read-only memory is formed by at least one electrode structure in the memory cell being covered by the isolating material (6), that one or more additional logic states in a memory cell (5) in the read-only memory is formed by an active portion of the semiconductor material (9) covering the diode junction comprises only a part of the contact area (11), such that the data which are stored in the memory may be represented by the logic states in a multi-valued code, and that said one or more additional logic states are given by impedance values determined by the extension of the active portion of the semiconductor material and the extension of the part of the contact area which forms the diode junction.

24. A read-only memory according to claim 23, wherein the read-only memory constitutes a binary logic memory with only one additional logic state, characterized in that the first logic state which either represents a logical 0 or a logical 1, is given by the effective forward bias resistance of a diode formed in a memory cell (5) wherein the semiconductor material (9) contacts both the x electrode (2) and the y electrode (4), and that additional logic states which correspondingly represent either a logical 1or a logical 0 are given by a selected resistance value for the isolating material (6) provided in a memory cell (5) wherein the semiconductor material (9) at most contacts either the x electrode (2) or the y electrode (4).

25. A read-only memory according to claim 24, characterized in that the isolating material (6) in a memory cell has a resistance value approaching infinity.

26. A read-only memory according to claim 23, wherein the read-only memory is realized as a multilevel logic memory with two or several further logic states, characterized in that the first logic state is given by the effective forward bias resistance of a diode formed in a memory cell (5) wherein the semiconductor material (9) contacts both the x and the y electrodes (2,4) and that the additional logic states are given by determined resistance values for the isolating material (6) provided in a memory cell (5) wherein the semiconductor material (9) at most contacts either the x electrode (2) or the y electrode (4) and the selected determined resistance value in each case lies between the effective forward bias resistance of a memory cell (5) formed with a diode, and a value approaching infinity.

27. A read-only memory according to claim 23, characterized in that the isolating material (6) in selected memory cells (5) is provided between the electrode structure in the form of a separate layer-like isolator patch (7) which wholly or partly covers at least one of the electrodes (2,4) in the memory cell (5), a selected memory cell dependent on the active portion of the semiconductor material and/or the diode junction part of the contact area in the latter case acquiring a logic state which corresponds to a level in a multi-valued code.

28. A read-only memory according to claim 27, wherein the isolator patch (7) wholly or partly covers only one of the electrodes (2, 4), characterized in that the semiconductor material (9) is provided between the electrode structures in a global layer and besides over the isolator patches (7) in the selected memory cells (5).

29. A read-only memory according to claim 27, wherein the isolator patch (7) wholly or partly covers both electrodes (2, 4), characterized in that the semiconductor material (9) is provided only between the electrode structures and adjacent to the isolator patches (7) in the selected memory cells (5), such that the semiconductor material (9) and isolator patches (7) mutually flush in a common continuous layer.

30. A read-only memory according to claim 23, characterized in that the isolating material (6) is provided between the electrode structures in the form of a substantially global layer which covers at least one of the electrode structures and with removed portions (8) in selected memory cells (5), such that the removed portion wholly or partly exposes the electrodes (2, 4) in a selected memory cell (5), said memory cell dependent on the active portion of the semiconductor material (9) and for tile diode junction part of the contact area (11) in the latter case acquiring a logic state which corresponds to a level in a multi-valued code.

31. A read-only memory according to claim 30, wherein the isolating layer (6) covers only one of the electrode structures, characterized in that the semiconductor material (6) is provided between the electrode structures and over the isolating layer (6) in a global layer and besides contacts the electrode structures in the removed portions of the isolating layer (6).

32. A read-only memory according to claim 30, wherein the isolating layer (6) covers both electrode structures characterized in that the semiconductor material (9, 10) is provided only between the electrode structures and adjacent to the isolating layer (6) in the selected memory cells (5), such that the semiconductor material (9, 10) and the isolating layer (6) mutually flush in a common continuous layer.

33. A read-only memory according to claim 23, characterized in that the semiconductor material (9) is amorphous silicon.

34. A read-only memory according to claim 23, characterized in that the semiconductor material (9) is polycrystalline silicon.

35. A read-only memory according to claim 23, characterized in that the semiconductor material (9) is an organic semiconductor.

36. A read-only memory according to claim 35, characterized in that the organic semiconductor (9) is a conjugated polymer.

37. A read-only memory according to claim 23, characterized in that the semiconductor material (9) is an anisotropic conductor.

38. A read-only memory according to claim 23, characterized in that the semiconductor material (9) comprises various materials having different properties.

39. A read-only memory according to claim 23, characterized in that the semiconductor material (9) has been added or combined with an electrical conducting material.

40. A read-only memory according to claim 23, characterized in that the semiconductor material (9), the isolating material (6) and the electrode structures are realized as thin films.

41. A read-only memory device comprising one or more read-only memories (ROM) according to claim 23, characterized in that the read-only memory (ROM) is provided on a substrate (1) of semiconductor material and via the substrates connected with driver and control circuits (13) for driving and addressing, said driving and control circuits (13) being integrated in the substrate (1) and realized in a semiconductor technology compatible with the substrate material.

42. A read-only memory device comprising two or more read-only memories according to claim 23, characterized in that the read-only memory is stacked in horizontal layers (15) in order to provide a volumetric memory device, that the volumetric memory device is provided on a substrate (1) of semiconductor material and via the substrate or the substrates connected with driver and control circuits (13) for driving and addressing, said driving and control circuits (13) being integrated with the substrate (1) and realized in a semiconductor technology compatible with the substrate material.

43. A read-only memory device comprising one or more read-only memories (ROM) according to claim 23, characterized in that the read-only memory (ROM) is provided between substrates (1;3) of semiconductor material and via the substrates connected with driver and control circuits (13) for driving and addressing, said driving and control circuits (13) being integrated in the substrates (1;3) and realized in a semiconductor technology compatible with the substrate material.

44. A read-only memory device comprising two or more read-only memories according to claim 23, characterized in that the read-only memory is stacked in horizontal layers (15) in order to provide a volumetric memory device, that the volumetric memory device is provided between substrates (1;3) of semiconductor material and via the substrate or the substrates connected with driver and control circuits (13) for driving and addressing, said driving and control circuits (13) being integrated with the substrates (1;3) and realized in a semiconductor technology compatible with the substrate material.

* * * * *